United States Patent
Nakamura et al.

(12) United States Patent (10) Patent No.: US 10,985,309 B2
(45) Date of Patent: Apr. 20, 2021

(54) MULTILAYER CERAMIC ELECTRONIC COMPONENT AND METHOD FOR MANUFACTURING SAME

(71) Applicant: Murata Manufacturing Co., Ltd., Nagaokakyo (JP)

(72) Inventors: Kimitoshi Nakamura, Nagaokakyo (JP); Hisanobu Nakashima, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 719 days.

(21) Appl. No.: 15/673,622

(22) Filed: Aug. 10, 2017

(65) Prior Publication Data

US 2017/0338397 A1    Nov. 23, 2017

Related U.S. Application Data

(63) Continuation of application No. PCT/JP2016/056367, filed on Mar. 2, 2016.

(30) Foreign Application Priority Data

Mar. 12, 2015    (JP) .............................. JP2015-049764

(51) Int. Cl.
*H01L 41/047*    (2006.01)
*H01G 4/232*    (2006.01)
(Continued)

(52) U.S. Cl.
CPC .......... *H01L 41/0472* (2013.01); *H01G 4/12* (2013.01); *H01G 4/232* (2013.01); *H01G 4/30* (2013.01);
(Continued)

(58) Field of Classification Search
CPC ... H01L 41/09; H01L 41/047; H01L 41/0472; H01L 41/0475; H01L 41/083
(Continued)

(56) References Cited

U.S. PATENT DOCUMENTS 5,504,388 A * 4/1996 Kimura .................. H01L 41/29
                                                                        310/363
8,970,534 B2    3/2015 Adachi et al.
(Continued)

FOREIGN PATENT DOCUMENTS

JP    H06-70260 U    9/1994
JP    2006-324518 A    11/2006
(Continued)

OTHER PUBLICATIONS

International Search Report issued in International Application No. PCT/JP2016/056367, dated May 24, 2016.
(Continued)

*Primary Examiner* — Derek J Rosenau
(74) *Attorney, Agent, or Firm* — Arent Fox LLP (57) ABSTRACT

A multilayer ceramic electronic component is provided in which wet spreading of a metal bump material can be suppressed and a position of the metal bump can be controlled with high accuracy. The multilayer ceramic electronic component includes a ceramic body having first and second main surfaces and first to fourth lateral surfaces between the main surfaces. Moreover, first and second opposing internal electrodes are provided inside the ceramic body and led out to one or more of the second lateral surfaces. A first electrode is provided on the first main surface and contains a ceramic material and a first external electrode that is connected to the first internal electrode, extends on the first electrode. In addition, a second external
(Continued)

electrode is connected to the second internal electrode and extends onto the first main surface.

11 Claims, 4 Drawing Sheets

(51) Int. Cl.
    *H01G 4/12*     (2006.01)
    *H01G 4/30*     (2006.01)
    *H01L 41/29*     (2013.01)
    *H01L 41/083*     (2006.01)
    *H01L 41/273*     (2013.01)

(52) U.S. Cl.
    CPC ...... *H01L 41/0475* (2013.01); *H01L 41/0477* (2013.01); *H01L 41/083* (2013.01); *H01L 41/273* (2013.01); *H01L 41/29* (2013.01)

(58) Field of Classification Search
    USPC .......................................... 310/328, 365, 366
    See application file for complete search history.

(56) References Cited

U.S. PATENT DOCUMENTS

| | | | |
|---|---|---|---|
| 9,117,993 B2 | 8/2015 | Shimizu et al. | |
| 9,117,994 B2 | 8/2015 | Adachi et al. | |
| 9,299,908 B2 | 3/2016 | Nakamura et al. | |
| 2010/0206624 A1* | 8/2010 | Feichtinger | H01G 4/40 174/260 |
| 2013/0069490 A1 | 3/2013 | Nakamura et al. | |
| 2013/0221807 A1 | 8/2013 | Shimizu et al. | |
| 2013/0271412 A1 | 10/2013 | Adachi et al. | |
| 2014/0028157 A1 | 1/2014 | Adachi et al. | |
| 2014/0293503 A1* | 10/2014 | Sasabayashi | H01G 4/30 361/301.4 |
| 2016/0099400 A1 | 4/2016 | Uetani et al. | |

FOREIGN PATENT DOCUMENTS

| | | |
|---|---|---|
| JP | 2007-74892 A | 3/2007 |
| JP | 2007-109754 A | 4/2007 |
| JP | 2008-66560 A | 3/2008 |
| JP | 2012-64674 A | 3/2012 |
| JP | 2013-211432 A | 10/2013 |
| JP | 2014-63992 A | 4/2014 |
| WO | WO 2011/145453 A1 | 11/2011 |
| WO | WO 2014/208376 A1 | 12/2014 |

OTHER PUBLICATIONS

Written Opinion of the International Searching Authority issued in International Application No. PCT/JP2016/056367, dated May 24, 2016.

* cited by examiner

MULTILAYER CERAMIC ELECTRONIC COMPONENT AND METHOD FOR MANUFACTURING SAME

CROSS-REFERENCE TO RELATED APPLICATIONS

The present application is a continuation of PCT/JP2016/056367 filed Mar. 2, 2016, which claims priority to Japanese Patent Application No. 2015-049764, filed Mar. 12, 2015, the entire contents of each of which are incorporated herein by reference.

TECHNICAL FIELD

The present disclosure relates to a multilayer ceramic electronic component, and a method for manufacturing the same.

BACKGROUND

Multilayer ceramic electronic components are widely used in mobile telephones and the like.

Patent Literature 1 (identified below) discloses an example of a multilayer ceramic electronic component. The multilayer ceramic electronic component has an external electrode provided on a lateral surface of a ceramic body. On the external electrode, a solder bump is provided.

Patent Literature 1: Japanese Patent Laid-Open No. 2008-66560.

Typically, in conventional multilayer ceramic electronic components, when a solder bump is provided on an external electrode, solder is sometimes scattered. Electrodes connected to different potentials are sometimes short-circuited by the scattered solder.

In Patent Literature 1, a resist is provided on a lateral side of a portion where the solder bump is provided, so that scattering of the solder is suppressed. However, the method disclosed in Patent Literature 1 is still insufficient.

SUMMARY

An object of the present disclosure is to provide a multilayer ceramic electronic component in which wet spreading of a metal bump material can be suppressed and a position of a metal bump can be controlled with high accuracy. Moreover, a method is disclosed for manufacturing the same.

A multilayer ceramic electronic component is disclosed that includes a ceramic body that has first and second main surfaces extending along a first direction and a second direction different from the first direction, and facing each other, first and third lateral surfaces extending along the first direction, extending along a third direction perpendicular to the first and second directions, and facing each other, and second and fourth lateral surfaces extending along the second direction and the third direction, and facing each other. Moreover, a first internal electrode is provided inside the ceramic body, and is led out to the second lateral surface of the ceramic body, and a second internal electrode is provided inside the ceramic body, is led out to at least one of the second lateral surface and the fourth lateral surface of the ceramic body and faces the first internal electrode in the third direction. Furthermore, a first electrode is provided on the first main surface of the ceramic body is electrically connected to the first internal electrode and contains a ceramic material. A first external electrode is provided so as to extend onto the first electrode from the second lateral surface of the ceramic body, and electrically connects the first electrode to the first internal electrode, and a second external electrode is provided so as to extend onto the first main surface from the lateral surface to which the second internal electrode is led out, among the second lateral surface and the fourth lateral surface, and is electrically connected to the second internal electrode.

In a specific aspect of the multilayer ceramic electronic component, the first and second external electrodes each do not contain a ceramic material. In this case, it is possible to control a position of a metal bump with higher accuracy.

In another specific aspect of the multilayer ceramic electronic component, the first and second external electrodes are each made of a metal thin film. In this case, it is possible to easily provide the first and second external electrodes by a thin film forming method or the like. Accordingly, it is possible to enhance productivity.

In yet another specific aspect of the multilayer ceramic electronic component, the second internal electrode is led out to the second lateral surface of the ceramic body. In this case, it is possible to easily provide the first and second external electrodes at the same time. Accordingly, it is possible to enhance productivity.

In another specific aspect of the multilayer ceramic electronic component, the multilayer ceramic electronic component further includes a third external electrode that is provided on a part of the first electrode. In this case, it is possible to broaden the width of design.

In yet another specific aspect of the multilayer ceramic electronic component, the third external electrode does not contain a ceramic material. In this case, it is possible to control the position of the metal bump with higher accuracy.

In yet another specific aspect of the multilayer ceramic electronic component, the third external electrode is made of a metal thin film. In this case, it is possible to easily provide the third external electrode by a thin film forming method or the like. Accordingly, it is possible to enhance productivity.

In yet another specific aspect of the multilayer ceramic electronic component, the first electrode does not extend up to an outer peripheral edge of the first main surface of the ceramic body. In this case, at a time of dicing for obtaining the multilayer ceramic electronic component, the first electrode is not divided. Accordingly, at the time of dicing, the first electrode is unlikely to be peeled. Therefore, the multilayer ceramic electronic component has high reliability.

A method is disclosed for manufacturing a multilayer ceramic electronic component that includes preparing a raw ceramic body having first and second main surfaces extending along a first direction and a second direction different from the first direction, and facing each other, first and third lateral surfaces extending along the first direction, extending along a third direction perpendicular to the first and second directions, and facing each other, second and fourth lateral surfaces extending along the second direction and the third direction, and facing each other, and first and second conductive material layers provided therein, and facing each other in the third direction. Moreover, the first and second conductive material layers are led out to at least any one of the second lateral surface and the fourth lateral surface. The method further includes providing a third conductive material layer on the first main surface of the raw ceramic body; obtaining a mother ceramic body having first and second main surfaces, and first to fourth lateral surfaces by baking the raw ceramic body, forming first and second internal electrodes by baking the first and second conductive material layers, and forming a first electrode by baking the third conductive material layer; providing a first external electrode so as to extend onto the first electrode from the lateral surface to which the first internal electrode is led out, among the second lateral surface and the fourth lateral surface of the mother ceramic body, and so as to connect the first internal electrode to the first electrode, and providing a second external electrode so as to extend onto the first main surface from the lateral surface to which the second internal electrode is led out, and so as to be connected to the second internal electrode; and dicing the mother ceramic body. In this case, it is possible to suppress wet spreading of a metal bump, and control a position of the metal bump with higher accuracy.

In a specific aspect of the method for manufacturing a multilayer ceramic electronic component the step of providing the first and second external electrodes includes providing the first and second external electrodes by a thin film forming method. In this case, it is possible to easily provide the first and second external electrodes. Accordingly, it is possible to enhance productivity.

In another specific aspect of the method for manufacturing a multilayer ceramic electronic component, the first and second external electrodes are provided by a sputtering method. In this case, the first and second external electrodes can be easily provided on the lateral surface to which the first and second internal electrodes are led out, among the second and fourth lateral surfaces of the ceramic body, and the first main surface. Accordingly, it is possible to further enhance productivity.

In yet another specific aspect of the method for manufacturing a multilayer ceramic electronic component, in the step of preparing the raw ceramic body, the first and second conductive material layers are led out to any of the second lateral surface and the fourth lateral surface of the raw ceramic body. In this case, it is possible to provide the first and second external electrodes at the same time. Accordingly, it is possible to further enhance productivity.

In another specific aspect of the method for manufacturing a multilayer ceramic electronic component, the step of providing the first and second external electrodes includes providing a third external electrode on a part of the first electrode. In this case, it is possible to broaden the width of design.

In yet another specific aspect of the method for manufacturing a multilayer ceramic electronic component, the third external electrode is provided by a thin film forming method. In this case, it is possible to easily provide the third external electrode. Accordingly, it is possible to enhance productivity.

In yet another specific aspect of the method for manufacturing a multilayer ceramic electronic component, the third external electrode is provided by a sputtering method. In this case, it is possible to easily provide the third external electrode. Accordingly, it is possible to enhance productivity.

In yet another specific aspect of the method for manufacturing a multilayer ceramic electronic component, the providing of the third conductive material layer includes providing the third conductive material layer on the first main surface so as not to extend up to an outer peripheral edge of each of the first main surfaces obtained after dicing of the mother ceramic body. In this case, in the step of dicing, the first electrode is not divided. Accordingly, at a time of dicing, the first electrode is unlikely to be peeled. Therefore, an obtained multilayer ceramic electronic component has high reliability.

According to the present disclosure, it is possible to provide a multilayer ceramic electronic component, in which wet spreading of a metal bump material can be suppressed, and a position of the metal bump can be controlled with high accuracy, and a method for manufacturing the same.

BRIEF DESCRIPTION OF DRAWINGS

FIG. 5($a$) to FIG. 5($c$) are each a perspective view for illustrating an example of a method for manufacturing the multilayer ceramic electronic component.

DETAILED DESCRIPTION OF EXEMPLARY EMBODIMENTS

Hereinafter, specific embodiments are described with reference to the drawings, so that the present disclosure will be clarified.

It is noted that respective embodiments described in the present disclosure are examples, partial replacement or combination of configurations of the different embodiments can be performed.

Figure 1:
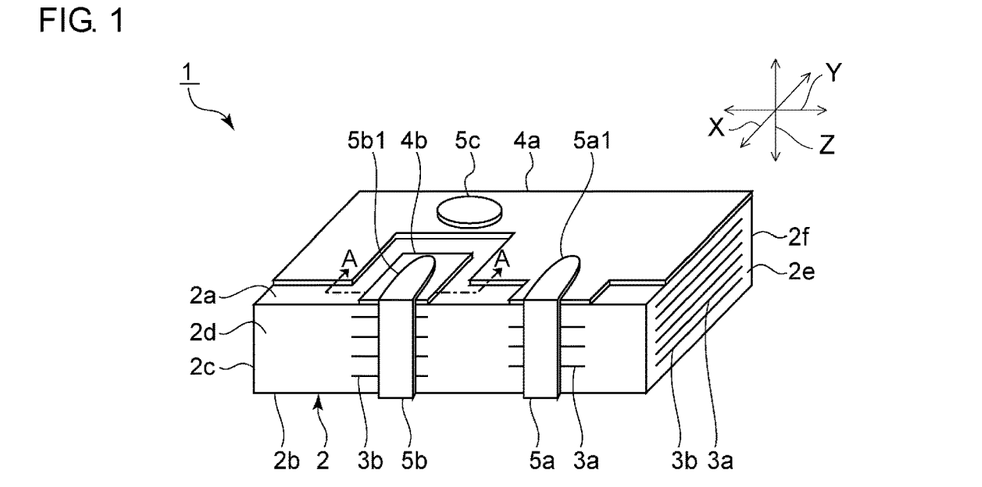
FIG. 1 is a perspective view of a multilayer ceramic electronic component according to a first exemplary embodiment.

FIG. 1 is a perspective view of a multilayer ceramic electronic component according to a first exemplary embodiment.

A multilayer ceramic electronic component 1 has a ceramic body 2. The ceramic body 2 has a rectangular parallelepiped shape. More specifically, the ceramic body 2 has first and second main surfaces $2a$, $2b$ that extend along a first direction X and a second direction Y different from the first direction X, and face each other. The ceramic body 2 has first and third lateral surfaces $2c$, $2e$ that extend along the first direction X, and a third direction Z perpendicular to the first and second directions X, Y, and facing each other. Furthermore, the ceramic body 2 has second and fourth lateral surfaces $2d$, $2f$ that extend along the second direction Y and the third direction Z, and face each other. In the present embodiment, the ceramic body 2 is made of a piezoelectric substance.

On the first main surface $2a$ of the ceramic body 2, first and second electrodes $4a$, $4b$ are provided. While the details will be described below, the first and second electrodes $4a$, $4b$ are formed by baking a conductive material layer laminated on the first main surface $2a$ of the ceramic body 2, and containing a ceramic material. Accordingly, the first and second electrodes $4a$, $4b$ each contain a metal material and a ceramic material. According to the exemplary aspect, the first and second electrodes $4a$, $4b$ are baked electrodes. The metal material of each of the first and second electrodes 4a, 4b of the present embodiment is made of Ag, although it should be appreciate that the metal material is not particularly limited.

In the present embodiment, there is no electrode provided on the second main surface 2b of the ceramic body 2. However, in another aspect, the first and second electrodes 4a, 4b may be provided also on the second main surface 2b.

Inside the ceramic body 2, a plurality of first and second internal electrodes 3a, 3b facing each other in the third direction Z are provided. The plurality of first and second internal electrodes 3a, 3b are led out to the second lateral surface 2d of the ceramic body 2. On the second lateral surface 2d, the plurality of first internal electrodes 3a and the plurality of second internal electrodes 3b do not overlap with each other in the third direction Z. The plurality of first and second internal electrodes 3a, 3b are also led out to a third lateral surface 2e of the ceramic body 2. On the third lateral surface 2e, the plurality of first internal electrodes 3a and the plurality of second internal electrodes 3b may overlap with each other in the third direction Z. The plurality of first and second internal electrodes 3a, 3b may be led out to the first and fourth lateral surfaces 2c, 2f. In this case, on the first and fourth lateral surfaces 2c, 2f, the plurality of first internal electrodes 3a and the plurality of second internal electrodes 3b may overlap with each other in the third direction Z. In the exemplary aspect, at least one first internal electrode 3a and at least one second internal electrode 3b are provided.

The plurality of first and second internal electrodes 3a, 3b each include a metal material and a ceramic material similarly to the first and second electrodes 4a, 4b. In the present embodiment, the metal material of each of the plurality of first and second internal electrodes 3a, 3b is made of an Ag—Pd alloy, although this metal material is not particularly limited. The plurality of first and second internal electrodes 3a, 3b and the first and second electrodes 4a, 4b may be made of the same material. In this case, it is possible to reduce kinds of materials.

On the second lateral surface 2d of the ceramic body 2, a first external electrode 5a is provided so as to be connected to the plurality of first internal electrodes 3a. The first external electrode 5a is provided so as to extend onto the first electrode 4a from the second lateral surface 2d. That is, the plurality of first internal electrodes 3a and the first electrode 4a are electrically connected to each other by the first external electrode 5a. The first external electrode 5a has a terminal section 5a1 located on the first electrode 4a.

On the second lateral surface 2d of the ceramic body 2, a second external electrode 5b is provided so as to be connected to the plurality of second internal electrodes 3b. The second external electrode 5b is provided so as to extend onto the second electrode 4b from the second lateral surface 2d. The plurality of second internal electrodes 3b and the second electrode 4b are electrically connected to each other by the second external electrode 5b. The second external electrode 5b has a terminal section 5b1 located on the second electrode 4b.

Furthermore, on a part of the first electrode 4a, a third external electrode 5c is provided. On the terminal sections 5a1, 5b1 of the first and second external electrodes 5a, 5b and on the third external electrode 5c, metal bumps are provided. The multilayer ceramic electronic component 1 is mounted through the metal bumps. The plurality of first internal electrodes 3a are electrically connected to the outside through the first external electrode 5a and the metal bump. Alternatively, the plurality of first internal electrodes 3a are electrically connected to the outside through the first external electrode 5a, the first electrode 4a, the third external electrode 5c and the metal bumps. The plurality of second internal electrodes 3b are electrically connected to the outside through the second external electrode 5b and the metal bumps. One third external electrode 5c may be provided, or a plurality of the third external electrodes 5c may be provided. Thus, it is possible to easily adjust a position for external connection. Accordingly, it is possible to broaden the width of design.

The metal bump may not be provided on either one of the terminal section 5a1 of the first external electrode 5a and the third external electrode 5c. In a case where the metal bump is provided on the terminal section 5a1 of the first external electrode 5a, the third external electrode 5c may not be provided in an exemplary aspect.

Preferably, the first to third external electrodes 5a to 5c of the present embodiment are each made of a metal thin film. More specifically, in the first external electrode 5a, a NiCr layer is laminated on the second lateral surface 2d of the ceramic body 2 and on the first electrode 4a. A NiCu layer is laminated on the NiCr layer. On the NiCu layer, an Ag layer is laminated. The second external electrode 5b and the third external electrode 5c are similarly formed on the second lateral surface 2d of the ceramic body 2, the second electrode 4b, and the first electrode 4a. As the respective thicknesses of the first to third external electrodes 5a to 5c, the thickness of the NiCr layer is 0.1 μm. The thickness of the NiCu layer is 0.15 μm. The thickness of the Ag layer is 0.2 μm. The materials and the thicknesses of the first to third external electrodes 5a to 5c are not particularly limited. For example, each of the first to third external electrodes 5a to 5c may be a single layer. Alternatively, the respective materials of the first to third external electrodes 5a to 5c may be different.

According to the exemplary embodiment, the first and second external electrodes 5a, 5b have the terminal sections 5a1, 5b1 located on the first and second electrodes 4a, 4b, respectively. Consequently, it is possible to suppress wet spreading of the metal bump materials, and control the positions of the metal bump with high accuracy. This will be hereinafter described.

Conventionally, when a metal bump is provided on an upper surface of a multilayer ceramic electronic component, wet spreading of a metal bump material in a molten state widely occurs. Electrodes, potentials that are to be different, are electrically connected to each other through the metal bump material that wetly spreads, which may result in short circuit failure sometimes.

In contrast, in the present embodiment, the terminal sections 5a1, 5b1 of the first and second external electrodes 5a, 5b, and the third external electrode 5c are provided on the first and second electrodes 4a, 4b. The first to third external electrodes 5a to 5c do not include a ceramic material. Therefore, the wet spreading of the metal bump material occurs on the terminal sections 5a1, 5b1 of the first and second external electrodes 5a, 5b, and the third external electrode 5c. On the other hand, the first and second electrodes 4a, 4b include the ceramic material. Accordingly, even when the metal bump material is in contact with the first and second electrodes 4a, 4b, the wet spreading of the metal bump material is unlikely to occur. Thus, it is possible to suppress wet spreading of the metal bump material, and control the positions of the metal bumps with high accuracy. Accordingly, it is possible to suppress occurrence of short circuit failure according to the exemplary embodiment.

Figure 2:
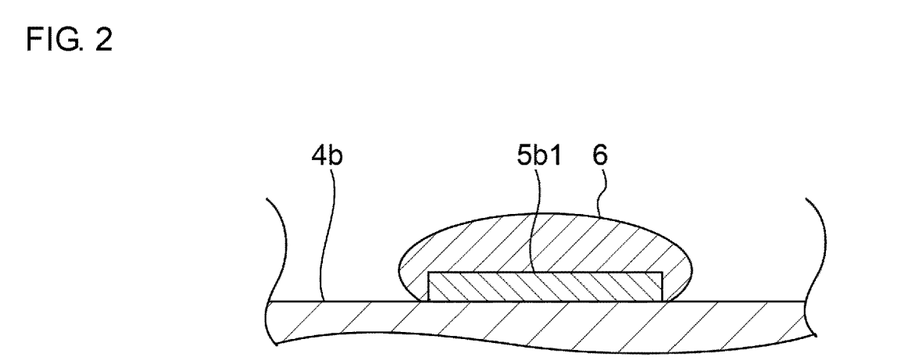
FIG. 2 is a partially enlarged sectional view of the multilayer ceramic electronic component equivalent to a portion taken along an A-A line in FIG. 1, which illustrates an example of a state where a metal bump is provided on a terminal section of a first external electrode according to the first exemplary embodiment.

FIG. 2 is a partially enlarged sectional view of the multilayer ceramic electronic component equivalent to a portion taken along an A-A line in FIG. 1. As shown, an example of a state where a metal bump is provided on a terminal section of a first external electrode is shown according to the first embodiment.

A metal bump 6 is provided on the terminal section 5b1 of the second external electrode. More specifically, in a cross-section illustrated in FIG. 2, the metal bump 6 is provided so as to cover the terminal section 5b1. The metal bump 6 extends onto the second electrode 4b, but does not spread on the second electrode 4b. As the metal bump 6, solder or the like can be used.

Returning to FIG. 1, the wet spreading of the metal bump material is unlikely to occur on the first electrode 4a, and therefore even when the area of the first electrode 4a is increased, short circuit failure is unlikely to occur. Accordingly, it is possible to increase the area of the first electrode 4a. Consequently, it is possible to increase the facing areas of the plurality of first and second internal electrodes 3a, 3b, and the first electrode 4a, and, therefore, enhance the performance of the multilayer ceramic electronic component.

In the present embodiment, any electrode is not provided on the second main surface 2b of the ceramic body 2. Accordingly, it is possible to easily distinguish the first main surface 2a from the second main surface 2b. Furthermore, it is possible to bring the second main surface 2b into contact with a ground potential. In this case, the ceramic body 2 is unlikely to be charged. Accordingly, influence by charging of the ceramic body 2 to an electrical property of the multilayer ceramic electronic component is unlikely to be caused.

The first electrode 4a may be provided on the second main surface 2b of the ceramic body 2. Consequently, even on the second main surface 2b, the plurality of first and second internal electrodes 3a, 3b, and the first electrode 4a can be made to face each other.

In the third direction Z, dummy electrodes may be provided at such positions inside the ceramic body 2 as to overlap with the plurality of first internal electrodes 3a. In this case, in the third direction Z, dummy electrodes are preferably provided also at such positions inside the ceramic body 2 as to overlap with the plurality of second internal electrodes 3b. Consequently, it is possible to make the thickness of the ceramic body more uniform. Alternatively, in the third direction Z, dummy electrodes may be provided at such positions inside the ceramic body 2 as to overlap with the plurality of first and second internal electrodes 3a, 3b. Consequently, it is possible to make the thickness of the ceramic body more uniform. In the present disclosure, the dummy electrodes indicate electrodes which are not electrically connected to the outside.

The dummy electrodes located at such positions as to overlap with the plurality of first internal electrodes 3a in the third direction Z are preferably located at positions on an X-Y plane where the plurality of second internal electrodes 3b extend in the first and second directions X, Y. Similarly, the dummy electrodes located at such positions as to overlap with the plurality of second internal electrodes 3b in the third direction Z are more preferably located at positions on an X-Y plane where the plurality of first internal electrodes 3a extend in the first and second directions X, Y. While the details will be described below, the dummy electrode can be consequently provided at the same time as when the first and second internal electrodes 3a, 3b are provided. Accordingly, it is possible to enhance productivity.

Figure 3:
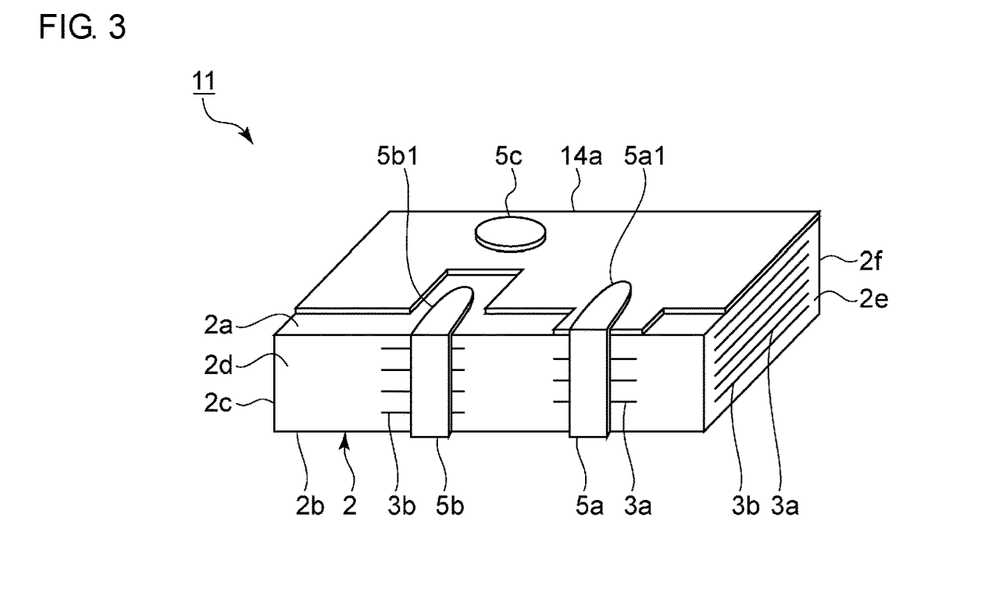
FIG. 3 is a perspective view of a multilayer ceramic electronic component according to a second exemplary embodiment.

FIG. 3 is a perspective view of a multilayer ceramic electronic component according to a second exemplary embodiment.

A multilayer ceramic electronic component 11 does not have the second electrode. The area of a first electrode 14a is larger than the area of the first electrode 4a in the first embodiment. Except the above point, the multilayer ceramic electronic component 11 has the same configuration as the multilayer ceramic electronic component 1 of the first exemplary embodiment.

A terminal section 5b1 of a second external electrode 5b is directly provided on a first main surface 2a of a ceramic body 2. Accordingly, wet spreading of a metal bump material is unlikely to occur outside the terminal section 5b1 of the second external electrode 5b. Therefore, similarly to the first embodiment, it is possible to suppress the wet spreading of the metal bump material, and control the position of the metal bump with high accuracy.

Furthermore, the second electrode is not provided on the first main surface 2a of the ceramic body 2, and therefore it is possible to increase the area of the first electrode 14a. Therefore, it is possible to further increase the area of facing portions of the plurality of first and second internal electrodes 3a, 3b.

Figure 4:
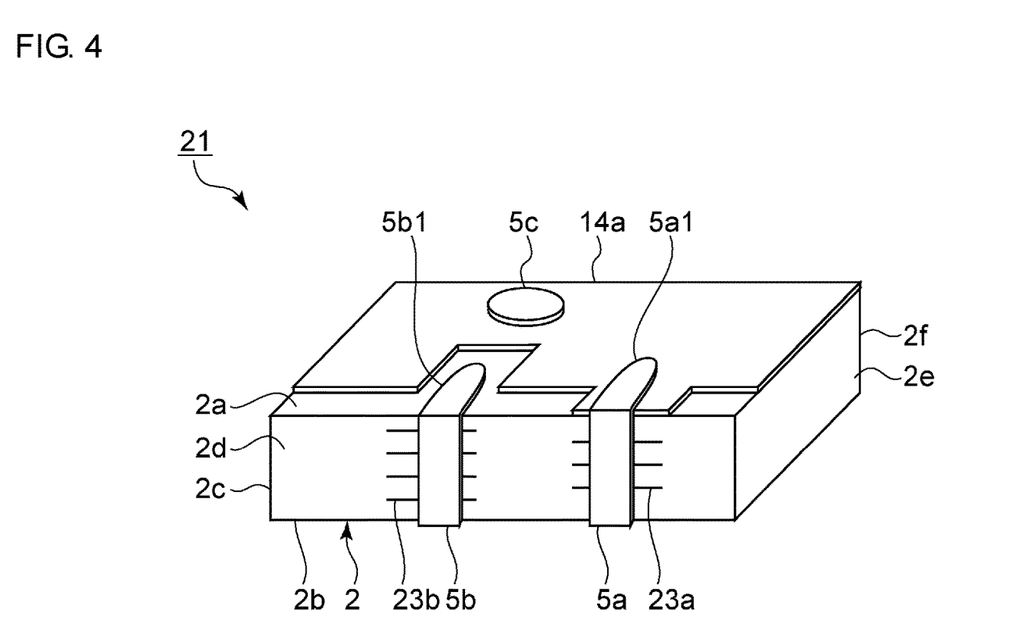
FIG. 4 is a perspective view of a multilayer ceramic electronic component according to a third exemplary embodiment.

FIG. 4 is a perspective view of a multilayer ceramic electronic component according to a third exemplary embodiment.

A plurality of first and second internal electrodes 23a, 23b of a multilayer ceramic electronic component 21 are not led out to a third lateral surface 2e of a ceramic body 2. Although not illustrated, the first and second internal electrodes 23a, 23b are not led out to first and fourth lateral surfaces 2c, 2f of the ceramic body 2. Except the above points, the multilayer ceramic electronic component 21 has the same configuration of the multilayer ceramic electronic component 11 of the second exemplary embodiment.

Also in the present embodiment, a terminal section 5a1 of a first external electrode 5a and a terminal section 5b1 of a second external electrode 5b are provided on a first electrode 14a, and on a first main surface 2a of the ceramic body 2, respectively. Accordingly, it is possible to obtain the same effects as the second embodiment.

Furthermore, the first and second internal electrodes 23a, 23b are not lead out to the first, third, and fourth lateral surfaces 2c, 2e, 2f. Consequently, when metal bumps are provided, sudden connection of the plurality of first and second internal electrodes 23a, 23b is unlikely to be generated. Therefore, short circuit failure will also not likely occur according to the exemplary embodiment.

The lateral surface of the ceramic body 2, of which the first and second internal electrodes 23a and 23b are not led out, only needs to be at least one surface of the first, third, and fourth lateral surfaces 2c, 2e, 2f of the ceramic body 2.

Now, an example of a method for manufacturing the multilayer ceramic electronic component will be described.

Figure 5A:
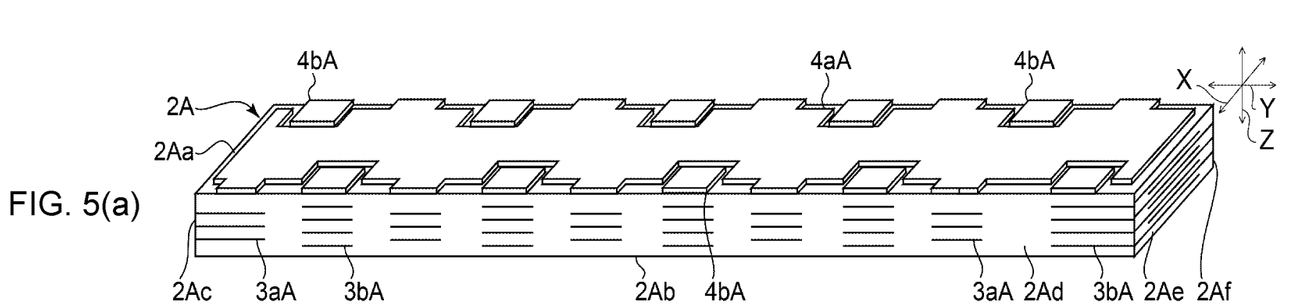
Figure 5B:
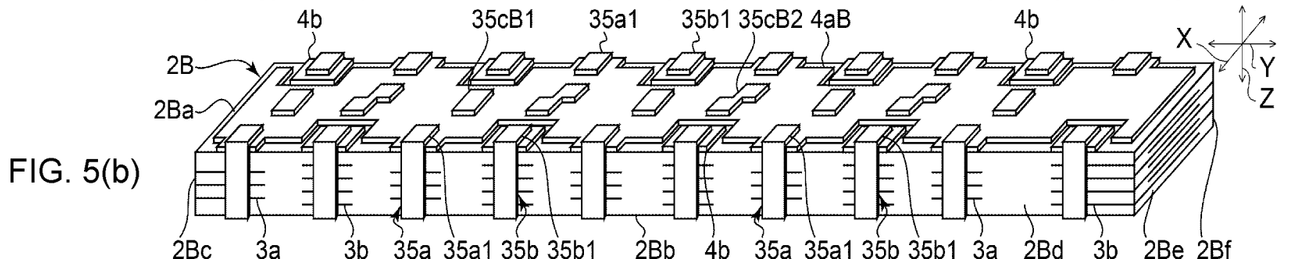
Figure 5C:
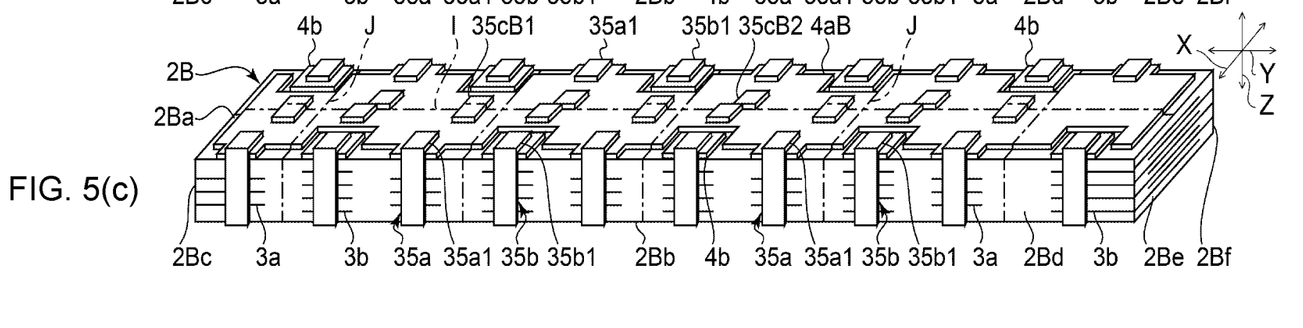

FIG. 5(a) to FIG. 5(c) are each a perspective view for illustrating an example of a method for manufacturing the multilayer ceramic electronic component.

As illustrated in FIG. 5(a), a raw ceramic body 2A having first and second main surfaces 2Aa, 2Ab, and first to fourth lateral surfaces 2Ac to 2Af is prepared. The first and second main surfaces 2Aa, 2Ab extend along a first direction X and a second direction Y, and face each other. The first and third lateral surfaces 2Ac, 2Ae extend along the first direction X and a third direction Z, and face each other. The second and fourth lateral surfaces 2Ad, 2Af extend along the second direction Y and the third direction Z, and face each other. Inside the raw ceramic body 2A, a plurality of first and second conductive material layers 3aA, 3bA facing each other in the third direction Z are provided. In this manufacturing method, each of the first and second conductive material layers 3aA, 3bA is made of a conductive paste. Each of the first and second conductive material layers 3aA, 3bA includes a suitable metal material and a suitable ceramic material. The above metal material is not particularly limited, but is made of, for example, an Ag—Pd alloy.

When the raw ceramic body 2A provided with the plurality of first and second conductive material layers 3aA, 3bA therein is obtained, for example, the plurality of second conductive material layers 3bA are laminated on a green sheet made of a suitable ceramic material. At this time, the second conductive material layers 3bA are laminated such that the second conductive material layers 3bA adjacent to an end of the green sheet equivalent to a second lateral surface 2Ad of the raw ceramic body 2A extend onto the above end. Similarly, the respective second conductive material layers 3bA are laminated such that the second conductive material layers 3bA adjacent to ends of the green sheets equivalent to the first, third, and fourth lateral surfaces 2Ac, 2Ae, 2Af of the raw ceramic body 2A extend onto the above ends. The second conductive material layers 3bA can be laminated by being applied while being patterned by a printing method, for example.

Next, a green sheet is further laminated on the plurality of second conductive material layers 3bA and the above green sheets. A plurality of first conductive material layers 3aA are laminated on the laminated green sheets. The plurality of first conductive material layers 3aA are also laminated so as to extend onto respective ends of each of the green sheets, similarly to the plurality of second conductive material layers 3bA. The plurality of first conductive material layers 3aA can be laminated by the same method as for the plurality of second conductive material layers 3bA. At this time, each of the first conductive material layer 3aA and each of the second conductive material layers 3bA are laminated so as not to overlap with each other in the third direction Z at the ends of the green sheet equivalent to the second and fourth lateral surfaces 2Ad, 2Af of the raw ceramic body 2A. It is noted that the first and second conductive material layers 3aA, 3bA do not necessarily extend onto the respective ends of each of the green sheets equivalent to the first and third lateral surfaces 2Ac, 2Ae of the raw ceramic body 2A.

Then, a green sheet is further laminated on the plurality of first conductive material layers 3aA and the above green sheets. Thus, lamination of green sheets, and lamination of a plurality of first conductive material layers 3aA, lamination of a plurality of second conductive material layers 3bA are repeated. Consequently, it is possible to obtain a raw ceramic body 2A provided with the first and second conductive material layers 3aA, 3bA therein.

Next, a third conductive material layer 4aA and a plurality of fourth conductive material layers 4bA are laminated on the first main surface 2Aa of the raw ceramic body 2A. The third conductive material layer 4aA and each of the fourth conductive material layers 4bA are each made of a conductive paste, similarly to each of the first and second conductive material layers 3aA, 3bA. The third conductive material layer 4aA is laminated so as to face the first and second conductive material layers 3aA, 3bA in the third direction Z. The third conductive material layer 4aA and the plurality of fourth conductive material layers 4bA can be laminated by the same method as for the plurality of first and second conductive material layers 3aA, 3bA. By using the printing method or the like, high accurate patterning can be performed. In one aspect, the plurality of fourth conductive material layers 4bA do not need to be always provided.

The raw ceramic body 2A is then baked according to the exemplary manufacturing method. Consequently, a mother ceramic body 2B having first and second main surfaces 2Ba, 2Bb and first to fourth lateral surfaces 2Bc to 2Bf, illustrated in FIG. 5(b), is formed. The first and second main surfaces 2Ba, 2Bb of the mother ceramic body 2B is equivalent to the first and second main surfaces 2Aa, 2Ab of the raw ceramic body 2A illustrated in FIG. 5(a). The first to fourth lateral surfaces 2Bc to 2Bf of the mother ceramic body 2B are equivalent to the first to fourth lateral surfaces 2Ac to 2Af of the raw ceramic body 2A. At the same time, the plurality of first and second conductive material layers 3aA, 3bA illustrated in FIG. 5(a) are baked, so that a plurality of first and second internal electrodes 3a, 3b are formed. The third conductive material layer 4aA is baked, so that a first electrode 4aB is formed. The plurality of fourth conductive material layers 4bA are baked, so that a plurality of second electrodes 4b are formed.

Thus, the plurality of first and second conductive material layers 3aA, 3bA, the third conductive material layer 4aA, and the plurality of fourth conductive material layers 4bA provided in the same raw ceramic body 2A are baked at the same time. That is, in a process of baking, the respective first and second conductive material layers 3aA, 3bA, the third conductive material layer 4aA, and the respective fourth conductive material layers 4bA contract or expand under the same circumstances. Accordingly, it is possible to enhance location accuracy of the plurality of first and second internal electrodes 3a, 3b, and the first electrode 4aB. Therefore, it is possible to increase the facing areas of the plurality of first and second internal electrodes 3a, 3b and the first electrode 4aB.

The third conductive material layer 4aA and the plurality of fourth conductive material layers 4bA are each preferably made of the same material as the plurality of first and second conductive material layers 3aA, 3bA. Consequently, an expansion amount or a contraction amount of each of the plurality of first and second conductive material layers 3aA, 3bA can be approximated to an expansion amount or a contraction amount of each of the third conductive material layer 4aA and the plurality of fourth conductive material layers 4bA. As a result, it is possible to further enhance the location accuracy of the plurality of first and second internal electrodes 3a, 3b, and the first electrode 4aB. In addition, it is possible to reduce thermal stress applied to the mother ceramic body 2B, and the mother ceramic body 2B can be unlikely to be damaged. It is also possible to reduce the number of kinds of materials.

In a process of providing a plurality of first and second conductive material layers 3aA, 3bA, a plurality of conductive material layers for dummy electrodes may be provided. The plurality of conductive material layers for dummy electrodes may be made of, for example, the same material as the plurality of first and second conductive material layers 3aA, 3bA. The plurality of conductive material layers for dummy electrodes can be easily provided by the printing method or the like at the same time when the plurality of first and second conductive material layers 3aA, 3bA are provided. In the above baking process, the plurality of dummy electrodes may be formed by baking the plurality of conductive material layers for dummy electrodes at the same time when the plurality of first and second conductive material layers 3aA, 3bA are baked. In this case, it is possible to make the thickness of the mother ceramic body more uniform.

Then, as illustrated in FIG. 5(b), a plurality of first external electrodes 35a are provided so as to extend onto the first electrode 4aB from a second lateral surface 2Bd of the mother ceramic body 2B. The respective first external electrodes 35a are provided so as to connect the plurality of first internal electrodes 3a led out to the second lateral surface 2Bd, and the first electrode 4aB. At this time, respective terminal sections 35a1, located on the first electrode 4aB, of the respective first external electrodes 35a are also provided. A plurality of second external electrodes 35b are also provided so as to extend onto the plurality of second electrodes 4b from the second lateral surface 2Bd. The respective second external electrodes 35b are provided so as to connect the plurality of second internal electrodes 3b led out to the second lateral surface 2Bd, and the respective second electrodes 4b. Terminal sections 35b1, located on the respective second electrodes 4b, of the respective second external electrodes 35b are also provided. In a case where the plurality of second electrodes 4b are not provided, the respective terminal sections 35b1 only need to be provided on the first main surface 2Ba of the mother ceramic body 2B.

Although not illustrated, the respective first external electrodes and the respective second external electrodes are provided to be continuous to the first electrode 4aB and the respective second electrodes 4b from the fourth lateral surface 2Bf of the mother ceramic body 2B.

According to the exemplary aspect, the plurality of first and second internal electrodes 3a, 3b do not overlap with each other in the third direction Z on the second and fourth lateral surfaces 2Bd, 2Bf of the mother ceramic body 2B. Accordingly, when the plurality of first and second external electrodes 35a, 35b are provided, complicated patterning is not needed. Therefore, it is possible to easily provide the plurality of first and second external electrodes 35a, 35b, and it is possible to enhance productivity.

Furthermore, a plurality of third external electrodes 35cB1, 35cB2 are provided on the first electrode 4aB. In this manufacturing method, each of the third external electrodes 35cB1 and each of the third external electrodes 35cB2 have different shapes, but may have the same shape in an alternative aspect.

The plurality of first, second, and third external electrodes 35a, 35b, 35cB1, 35cB2 can be provided by, for example, a thin film forming method. More specifically, the plurality of first, second, and third external electrodes 35a, 35b, 35cB1, 35cB2 can be preferably provided by a sputtering method. Consequently, the plurality of first, second, and third external electrodes 35a, 35b, 35cB1, 35cB2 can be easily provided on the second and fourth lateral surfaces 2Bd, 2Bf of the mother ceramic body 2B, the first electrode 4aB, and the plurality of second electrodes 4b at the same time. Accordingly, it is possible to enhance productivity.

More specifically, for example, a NiCr layer is laminated on the second and fourth lateral surfaces 2Bd, 2Bf of the mother ceramic body 2B, the first electrode 4aB, and the second electrode 4b by the sputtering method. Next, a NiCu layer is laminated on the NiCr layer by the sputtering method. Then, an Ag layer is similarly laminated on the NiCu layer. Thus, the respective first, second, and third external electrodes 35a, 35b, 35cB1, 35cB2 are formed by the NiCr layer, the NiCu layer, and the Ag layer. The first, second, and third external electrodes 35a, 35b, 35cB1, 35cB2 each may be a single layer.

Then, as illustrated in FIG. 5(c), the mother ceramic body 2B is diced. The mother ceramic body 2B can be diced by, for example, dicing along dicing lines I, J. Consequently, a plurality of the multilayer ceramic electronic components can be obtained by dicing the mother ceramic body 2B.

In a process of providing the third conductive material layer 4aA illustrated in FIG. 5(a), a plurality of third conductive material layers may be provided on the first main surface 2Aa of the raw ceramic body 2A so as not to extend up to outer peripheral edges of each diced first main surface. That is, a plurality of third conductive material layers may be provided so as not to extend up to the dicing lines I, J illustrated in FIG. 5(c). In this case, at the time of dicing, the mother ceramic body 2B can be diced without cutting the first electrode. Accordingly, in the dicing process, the first electrode is unlikely to be peeled. Therefore, it is possible to obtain a multilayer ceramic electronic component with high reliability.

Figure 6:
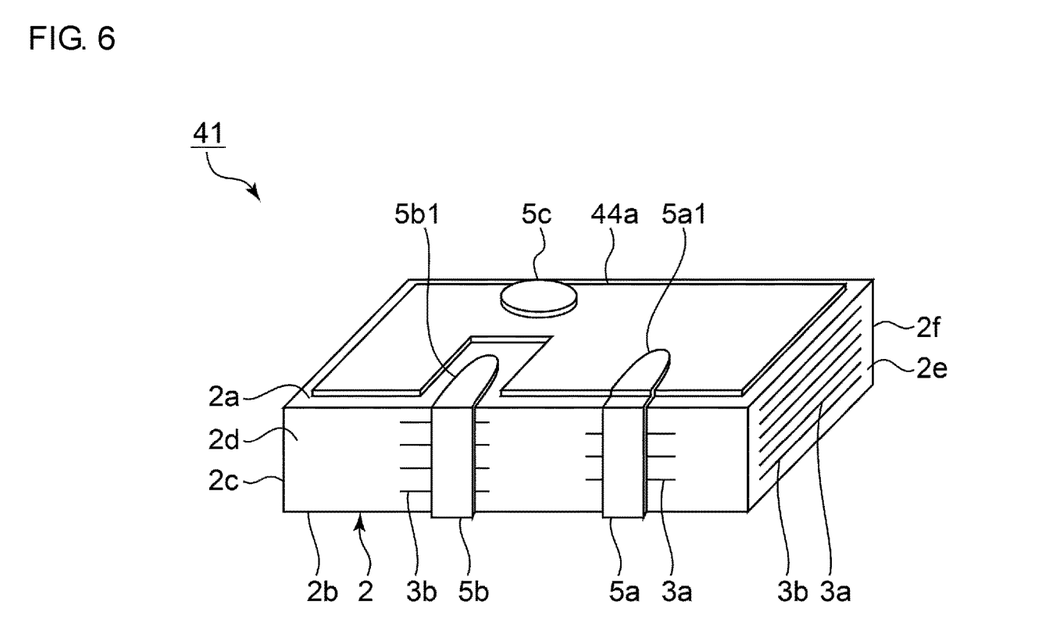
FIG. 6 is a perspective view of a multilayer ceramic electronic component according to a fourth exemplary embodiment.

FIG. 6 is a perspective view of a multilayer ceramic electronic component according to a fourth exemplary embodiment.

As shown, a first electrode 44a of a multilayer ceramic electronic component 41 does not extend up to an outer peripheral edge of a first main surface 2a of a ceramic body 2. Except the above point, the multilayer ceramic electronic component 41 has the same configuration as that of the multilayer ceramic electronic component 11 of the second embodiment.

Also in the multilayer ceramic electronic component 41, it is possible to obtain the same effects as the second embodiment. In addition, in the multilayer ceramic electronic component 41, the first electrode 44a is not cut in a dicing process for obtaining the multilayer ceramic electronic component. Accordingly, as described above, it is possible to enhance reliability.

The ceramic body 2 in each of the first to fourth embodiments is made of a piezoelectric substance, but the material of the ceramic body 2 is not limited to this. For example, the present embodiments are is also applicable to a multilayer ceramic electronic component made of a ceramic material which is not a piezoelectric substance.

REFERENCE SIGNS LIST

1 Multilayer ceramic electronic component
2 Ceramic body
2A Raw ceramic body
2B Mother ceramic body
2a, 2b First and second main surfaces
2c to 2f First to fourth lateral surfaces
2Aa, 2Ab First and second main surfaces
2Ac to 2Af First to fourth lateral surfaces
2Ba, 2Bb First and second main surfaces
2Bc to 2Bf First to fourth lateral surfaces
3a, 3b First and second internal electrodes
3aA, 3bA First and second conductive material layers
4a, 4b First and second electrodes
4aA, 4bA Third and fourth conductive material layers
4aB First electrode
5a to 5c First to third external electrodes
5a1, 5b1 Terminal section
6 Metal bump
11 Multilayer ceramic electronic component
14a First electrode
21 Multilayer ceramic electronic component
23a, 23b First and second internal electrodes
31 Multilayer ceramic electronic component
35a, 35b First and second external electrodes
35a1, 35b1 Terminal section
35cB1, 35cB2 Third external electrode
41 Multilayer ceramic electronic component
44a First electrode

The invention claimed is:

1. A multilayer ceramic electronic component comprising:
a ceramic body that has first and second main surfaces that oppose each other and extend in a first direction and a second direction different from the first direction, first and third lateral surfaces that oppose each other and that extend in the first direction and in a third direction perpendicular to the first and second directions, and second and fourth lateral surfaces that oppose each other and that extend in the second direction and the third direction;
at least one first internal electrode disposed inside the ceramic body and led out to the second lateral surface of the ceramic body;
at least one second internal electrode disposed inside the ceramic body and led out to at least one of the second lateral surface and the fourth lateral surface of the ceramic body, the at least one second internal electrode opposing the at least one first internal electrode in the third direction;
a first electrode disposed on only a portion of the first main surface of the ceramic body and including a ceramic material;
a first external electrode disposed on top of only a portion of the first electrode such that a remaining portion of the first electrode is exposed from the first external electrode, with the first external electrode extending on the second lateral surface of the ceramic body and directly connected to the at least one first internal electrode to electrically connect the first electrode to the at least one first internal electrode; and
a second external electrode extending on a lateral surface of which the at least one second internal electrode is led out, among the second lateral surface and the fourth lateral surface, the second external electrode being electrically connected to the at least one second internal electrode.

2. The multilayer ceramic electronic component according to claim 1, wherein the first and second external electrodes each do not comprise a ceramic material.

3. The multilayer ceramic electronic component according to claim 2, wherein the first and second external electrodes each are formed of a metal thin film.

4. The multilayer ceramic electronic component according to claim 1, wherein the at least one second internal electrode is led out to the second lateral surface of the ceramic body.

5. The multilayer ceramic electronic component according to claim 1, further comprising a third external electrode disposed on at least a part of the first electrode.

6. The multilayer ceramic electronic component according to claim 5, wherein the third external electrode does not comprise a ceramic material.

7. The multilayer ceramic electronic component according to claim 6, wherein the third external electrode is formed of a metal thin film.

8. The multilayer ceramic electronic component according to claim 1, wherein the first electrode does not extend to an outer peripheral edge of the first main surface of the ceramic body.

9. The multilayer ceramic electronic component according to claim 1, further comprising a second electrode disposed on a portion of the first main surface of the ceramic body that is different than the portion on which the first electrode is disposed, with the second electrode including a ceramic material, wherein the second external electrode is disposed directly on the second electrode and directly connected to the at least one second internal electrode to electrically connect the at least one second internal electrode to the second electrode.

10. The multilayer ceramic electronic component according to claim 9, further comprising a plurality of metal bumps disposed on the first and second external electrodes above the first and second electrodes, respectively, such that the plurality of metal bumps do not spread substantially on the first and second electrodes due to the ceramic in the first and second electrodes.

11. A multilayer ceramic electronic component comprising:
a ceramic body that has first and second rectangular main surfaces that oppose each other, a first pair of opposing lateral surfaces that extend between the first and second main surfaces, and a second pair of opposing lateral surfaces that are orthogonal to the first pair of opposing lateral surfaces and that extend between the first and second main surfaces;
at least one first internal electrode disposed inside the ceramic body and extending to one lateral surface of the second pair of opposing lateral surfaces;
at least one second internal electrode disposed inside the ceramic body and opposing the at least one first internal electrode in a thickness direction of the ceramic body, the at least one second internal electrode extending to at least one of the one lateral surface or a second lateral surface of the second pair of opposing lateral surfaces;
a first electrode disposed on only a portion of the first main surface of the ceramic body and including a ceramic material;
a first external electrode disposed on top of only a portion of the first electrode such that a remaining portion of the first electrode is exposed from the first external electrode, with the first external electrode extending on the one lateral surface of the second pair of opposing lateral surfaces and directly connected to the at least one first internal electrode to electrically connect the first electrode to the at least one first internal electrode; and
a second external electrode extending on the lateral surface of which the at least one second internal electrode extends so as to be electrically connected to the at least one second internal electrode.

* * * * *